United States Patent
Ahn et al.

(10) Patent No.: US 6,952,125 B2
(45) Date of Patent: Oct. 4, 2005

(54) SYSTEM AND METHOD FOR SUPPRESSING NOISE IN A PHASE-LOCKED LOOP CIRCUIT

(75) Inventors: Youngho Ahn, Seoul (KR); Eunseok Song, Seoul (KR); Yido Koo, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 10/689,986

(22) Filed: Oct. 22, 2003

(65) Prior Publication Data

US 2004/0085103 A1 May 6, 2004

Related U.S. Application Data

(60) Provisional application No. 60/421,060, filed on Oct. 25, 2002.

(51) Int. Cl.[7] ............................. H03L 7/06; H03L 7/08
(52) U.S. Cl. ........................... 327/156; 377/48; 331/25
(58) Field of Search ................................ 327/147, 160, 327/148, 150, 156, 157, 159; 377/48; 331/1 A, 17, 25; 375/373, 375, 376

(56) References Cited

U.S. PATENT DOCUMENTS

| | | | | |
|---|---|---|---|---|
| 5,038,117 A | * | 8/1991 | Miller | 331/16 |
| 5,070,310 A | * | 12/1991 | Hietala et al. | 331/1 A |
| 5,777,521 A | * | 7/1998 | Gillig et al. | 331/16 |
| 6,566,964 B1 | * | 5/2003 | Hirano | 331/1 A |
| 6,603,360 B2 | * | 8/2003 | Kim et al. | 331/1 A |
| 6,642,800 B2 | * | 11/2003 | Drapkin et al. | 331/16 |
| 2002/0030546 A1 | * | 3/2002 | Keating | |
| 2002/0033738 A1 | * | 3/2002 | Saeki et al. | |
| 2003/0062959 A1 | * | 4/2003 | Tsuda et al. | |

OTHER PUBLICATIONS

Behzad Razavi, RF MICROELECTRONICS, Chapter 8.

* cited by examiner

*Primary Examiner*—Tuan T. Lam
(74) *Attorney, Agent, or Firm*—Fleshner & Kim, LLP

(57) ABSTRACT

A system and method for improving the signal-to-noise ratio of a frequency generator suppresses phase noise and noise generated from mismatches in the internal generator circuits. This is accomplished using a modulation scheme which shifts spurious noise signals outside the loop bandwidth of the generator. When shifted in this manner, the noise signals maybe removed entirely or to any desired degree using, for example, a filter located along the signal path of the generator. In one embodiment, a Sigma-Delta modulator controls the value of a pulse-swallow frequency divider situated along a feedback path of a phase-locked loop to achieve a desired level of noise suppression. In another embodiment, a reference signal input into a phase-locked loop is modulated to effect noise suppression. In another embodiment, the foregoing forms of modulation are combined to accomplish the desired frequency shift. Through these modulation techniques, the signal-to-noise ratio of the frequency generator may be substantially improved while simultaneously achieving faster lock times.

40 Claims, 8 Drawing Sheets

SYSTEM AND METHOD FOR SUPPRESSING NOISE IN A PHASE-LOCKED LOOP CIRCUIT

This application claims benefit to U.S. Provisional Patent Application 60/421,060, filed on Oct. 25, 2002, the entire contents of which are incorporated herein by reference.

BACKGROUND OF THE INVENTION

1. Field of the Invention

This invention relates to generating frequency signals in a signal processing system.

2. Description of the Related Art

Phase-Locked Loop (PLL) circuits have been used in many wireline and wireless applications for generating carrier frequencies and timing reference signals.

FIG. 1(a) shows a PLL which is commonly used in a communications transceiver. This circuit includes a phase and frequency detector 1, a loop filter 2, and a voltage-controlled oscillator 3 which outputs a signal $f_{out}$ at a desired frequency. A feedback loop connecting the oscillator to an input of the phase and frequency detector includes a divider 4 which divides the output of the oscillator by a value of (N+1)/N. A modulus control circuit outputs a signal to the divider for controlling the value of N.

In a PLL of the aforementioned type, it is well known that a trade-off exists between loop bandwidth and channel spacing. It is also known that channel spacing is the same as the comparison frequency. Given this relationship, it is often desirable to set the loop bandwidth of the PLL to be smaller than the comparison frequency by a factor often. Reducing the loop bandwidth to this value, however, produces a number of drawbacks.

For example, loop bandwidth not only affects channel spacing, it also affects the lock time and amount of phase noise in a PLL. In fact, loop bandwidth is inversely proportional to both of these values. Therefore, reducing the loop bandwidth to a value smaller than the comparison frequency by a factor of ten will produce a commensurate increase in phase noise and lock time, which has found to be undesirable for many applications.

Another drawback of the aforementioned PLL relates to a second type of noise. This noise appears in the form of spurious signals generated from mismatches that occur, for example, from the charge pump and the phase and frequency detector. More specifically, as shown in FIG. 1(b), one mismatch occurs between the UP and DOWN current (or more accurately the current sources) of the charge pump. Another mismatch occurs between the UP and DOWN signal paths in the phase and frequency detector, where ideally no mismatch should exist. These mismatches generate spurious signals which propagate throughout the host system to degrade performance and therefore, like phase noise, are also considered to be undesirable.

FIG. 2 shows the manner in which these spurious signals are formed. In this diagram, $f_{out}$ corresponds to the output frequency of the phase-locked loop and $f_{cutoff}$ corresponds to the cutoff frequency of the PLL loop filter. The difference between $f_{out}$ and $f_{cutoff}$ defines the loop bandwidth of the circuit. In operation, mismatches along the signal path of the loop generate one or more spurious signals $f_{sp}$ that are located very close to the output frequency $f_{out}$. In fact, the spurious signals are so close to the output frequency (Δf is very small) that they lie within the loop bandwidth of the circuit and therefore cannot be removed by the loop filter. These unsuppressed spurious signals further contribute to the degradation of signal quality and performance of the host system.

In view of the foregoing discussion, it is evident that there is a need for a system and method for effectively suppressing noise in phase-locked loop circuits and especially loop circuits that are used in host systems having low noise and lock-time requirements.

SUMMARY OF THE INVENTION

An object of the present invention to provide a system and method for effectively suppressing noise in a phase-locked loop circuit.

Another object of the present invention is to provide a system and method for suppressing at least two types of noise in a phase-locked loop, namely phase noise and spurious noise generated from mismatches that exist along the loop circuit signal path.

Another object of the present invention is to provide a system and method which achieves one or more of the aforementioned objects without placing any restrictions on loop bandwidth, operating frequency, or any other functional parameter of the phase-locked loop.

Another object of the present invention is to provide a system and method which achieves one or more of the aforementioned objects while simultaneously reducing the lock time of the phase-locked loop.

Another object of the present invention is to suppress at least one of the aforementioned types of noise using a loop filter of the phase-locked loop.

Another object of the present invention is to achieve one or more of the aforementioned objects for a phase-locked loop controlled by a Sigma-Delta modulator.

Another object of the present invention is to provide a control system which achieves one or more of the aforementioned objects and also modulates a reference signal for the phase-locked loop in away that finely adjusts the resolution of spurious noise suppression.

These and other objects and advantages of the present invention are achieved by providing a system and method which suppress noise from the output of a frequency generator such as a phase-locked loop. This is accomplished using a modulation scheme which shifts spurious noise signals outside the loop bandwidth of the generator. When shifted in this manner, the noise signals maybe removed entirely or to any desired degree using, for example, a standard filter located along the signal path of the generator. As a result, the signal-to-noise ratio of the generator is substantially improved, loop bandwidth may be increasd, and faster lock times may be realized.

In accordance with one embodiment, the present invention provides a noise supression method that generates a frequency signal from a phase-locked loop based on a reference signal and then removes noise from the frequency signal by shifting a spurious signal of a predetermined order outside a loop bandwidth of the PLL. The loop bandwidth may be defined by a cutoff frequency of a loop filter, or alternatively by a frequency range lying between an output frequency and cutoff frequency of the filter. To achieve complete noise suppression, first-order spurious signals are shifted outside the loop bandwidth. However, suppression of only higher-order signals maybe performed if application requirements so require or if otherwise desired.

The spurious noise signals are shifted by controlling the value of a pulse-swallow divider situated along a feedback path of the phase-locked loop. The value of this divider may be controlled by a Sigma-Delta modulator and more specifically the modulation ratio set within this circuit. The noise being suppressed includes at least one of phase noise and noise generated by mismatches that occur in the phase and frequency detector and/or the charge pump of the PLL.

In accordance with another embodiment, the present invention provides a method for suppressing noise by modulating a reference signal and then generating a frequency signal from a phase-locked loop based on the modulated reference signal. The modulation is performed to ensure that harmonics of the original reference signal and the modulated reference signal are not coincident, at least throughout a significant range of frequencies. Preferably, the modulated reference signal is used to generate the PLL frequency signal only during times when the harmonics are not coincident. This method maybe used to provide fine adjustments to the spurious noise suppression performed by the Sigma-Delta modulator discussed herein.

In accordance with another embodiment, the present invention provides a frequency generator which includes a phase-locked loop that generates a frequency signal based on a reference signal and a noise suppressor which shifts a spurious signal of a predetermined order outside a loop bandwidth of the PLL. The phase-locked loop includes a loop filter, and the loop bandwidth is defined by a cutoff frequency of the loop filter or corresponds to a frequency range that lies between the frequency signal generated from the PLL and a cutoff frequency of the filter. The noise suppressor preferably includes a frequency divider in a feedback loop of the PLL and a controller which sets the frequency divider to a value which performs the spurious signal shift. The frequency divider maybe a pulse-swallow divider and the controller may include a Sigma-Delta modulator. In addition to these features, the noise suppressor may include a reference signal modulator for fine tuning suppression of the spurious signals.

In accordance with another embodiment, the present invention provides a system for controlling a phase-locked loop comprising a divider which divides a frequency signal output from the PLL and a controller which sets the divider to a value which shifts a spurious noise signal of a predetermined order outside the loop bandwidth of the PLL. The loop bandwidth maybe defined based on the cutoff frequency of a loop filter and the divider value may be controlled to suppress virtually any order of spurious noise signals desired. The controller may also include a modulator for generating a modulated reference signal for fine tuning supression of the spurious signals.

DESCRIPTION OF THE PREFERRED EMBODIMENTS

Figure 3:
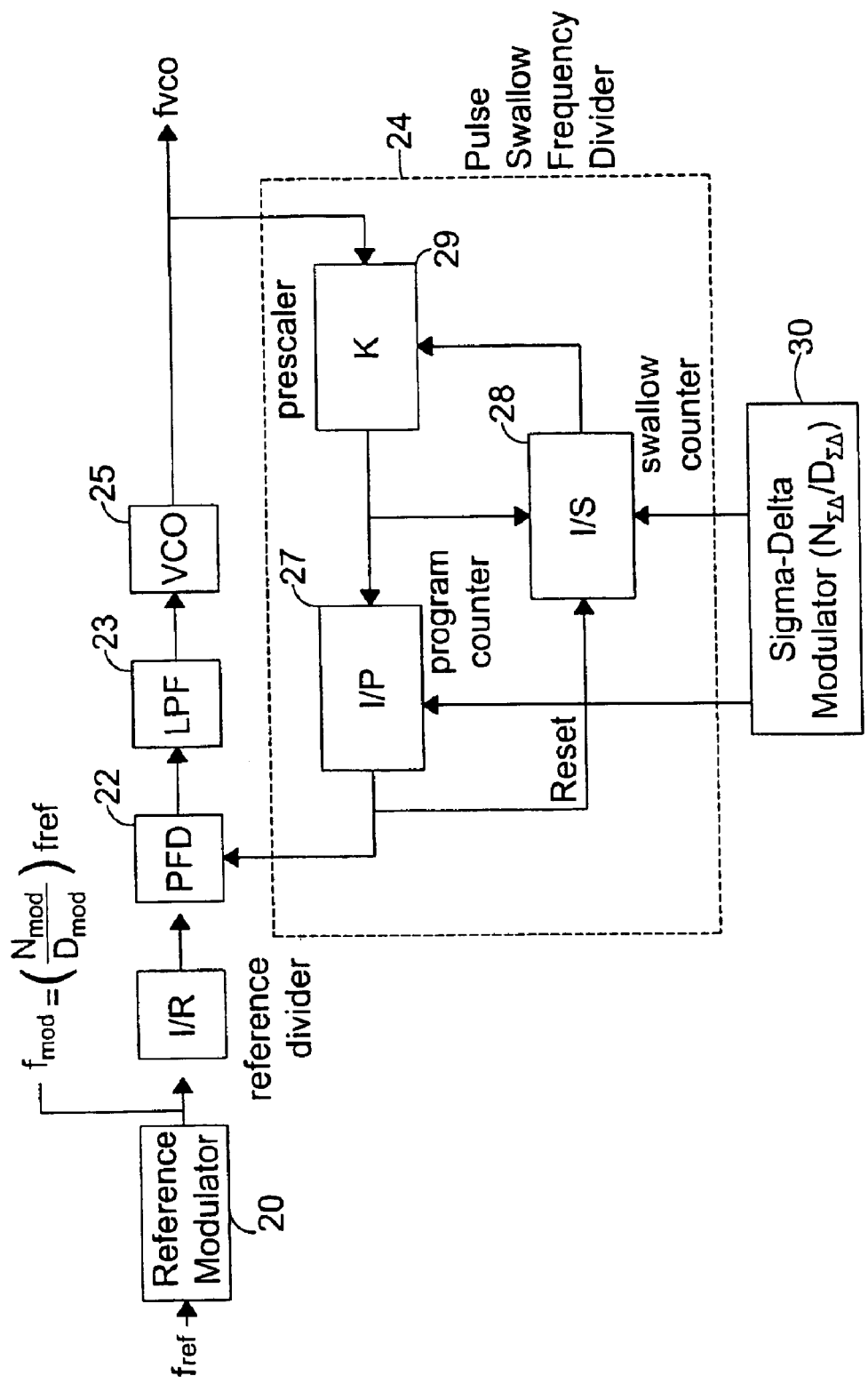
FIG. 3 is a diagram showing one embodiment of a phase-locked loop circuit in accordance with the present invention.

The present invention includes various embodiments of a system and method for suppressing noise in a phase-locked loop circuit. In accordance with one embodiment, the system and method suppresses noise that results from mismatches relating to the charge pump and phase and frequency detector. This is accomplished using a Sigma-Delta modulator which controls a divider in a feedback path of the PLL so that spurious noise components are shifted outside the operating loop bandwidth of the circuit. Other embodiments suppress noise by modulating a reference frequency signal input into the phase and frequency and detector. Still other embodiments suppress noise using a combination of the foregoing techniques. Through these embodiments, spurious noise components are shifted far away from the desired output frequency of the PLL so that they can be eliminated by a loop filter. As a result, a substantial improvement in signal-to-noise ratio and loop bandwidth may be realized along with a proportional reduction in phase noise and lock time Referring to FIG. 3, one embodiment of the system and method of the present invention includes a reference modulator 20 and a Sigma-Delta modulator 30 for controlling the output frequency of a phase-locked loop. The phase-locked loop is formed from a phase and frequency detector 22, a loop filter (e.g., a low-pass or bandpass filter) 23, a pulse-swallow frequency divider 24, and a voltage-controlled oscillator 25 for outputting a signal at a desired frequency $f_{vco}$. The pulse-swallow frequency divider includes a program counter 27 and swallow counter 28 which respectively assume values P and S under control of the Sigma-Delta modulator.

The Sigma-Delta modulator sets the values of the program and swallow counters based on parameters, $N_{\Sigma\Delta}$ and $D_{\Sigma\Delta}$, in order to generate the desired output frequency $f_{vco}$. This output signal may be used to modulate or demodulate signals in a communication transceiver or to perform any one of a variety of other purposes. The values of P, S, $N_{\Sigma\Delta}$ and $D_{\Sigma\Delta}$ maybe determined from the specific prescaler being used. Various prescalers and the manner in which they maybe used to set the values of the counters are generally known to those skilled in the art. See, for example, the text RF MICROELECTRONICS, Chapter 8, by Behzad Razavi.

Figure 2:
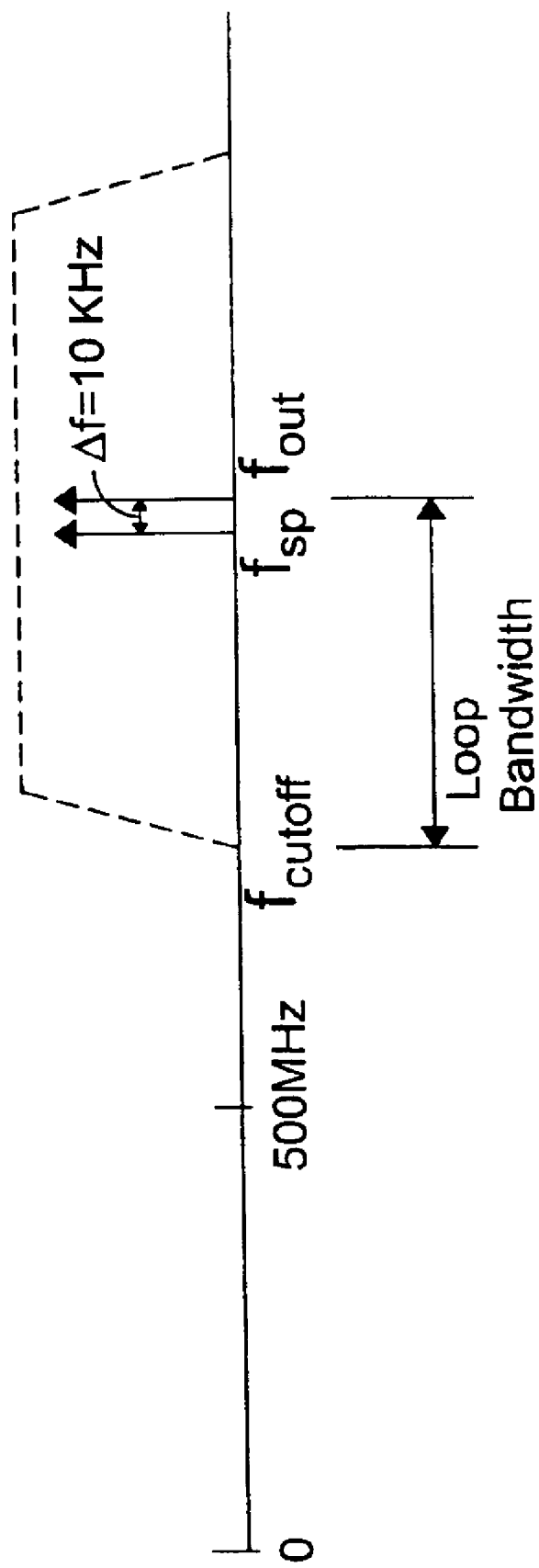
FIG. 2 is a diagram showing the generation of a spurious noise signal in the related-art circuit of FIG. 1(a).

If left uncorrected, the output frequency of the voltage-controlled oscillator will contain various types of noise, including spurious signals generated from mismatches relating to the phase and frequency detector and the charge pump. This situation is depicted in FIG. 2 where the frequency separation Δf is so small that the spurious signals cannot be removed by the loop filter. The present invention removes this and other types of noise (including phase noise) by shifting the spurious signals far away from the output frequency $f_{vco}$ of the PLL. This is accomplished through adjustments made by the Sigma-Delta modulator, which adjustments are preferably performed in combination with a modulation of the reference signal of the PLL.

First, the reference modulator modulates the input reference signal $f_{ref}$ by an amount which causes this signal to be multiplied by the value $$\frac{N_{mod}}{D_{mod}}.$$

This results in the formation of a modulated reference signal, $$f_{mod} = f_{ref} * \frac{N_{mod}}{D_{mod}},$$

which is input into the phase and frequency detector. To effect this modulation, the values of $N_{mod}$ and $D_{mod}$ are preferably selected to be integers by observing one or more of the following considerations:

1) The frequency range of the system. If the required frequency range is very narrow and only a few channels exist in the range, only one reference modulator maybe used. However, if the range is very wide, one reference modulator may not be sufficient to achieve a desired degree of spurious signal suppression. In this case, multiple reference modulators maybe included and selectively chosen to achieve an optimal degree of suppression. Tables 2 and 3 (discussed in greater detail infra) include non-limiting example of the values of $N_{mod}$ and $D_{mod}$ which may be used to perform the reference signal modulation of the present invention. If the required frequency range does not include the frequency of 944.65 MHz or 1102.1 MHz, 8/9 modulation may be enough for suppression. But, if that frequency is included another modulation such as 5/6 may be used for the applicable channel. This multiple reference-modulator embodiment is discussed in greater detail below.

2) The desired spur level for the system.

3) The loop filter bandwidth, which may be explained as follows. The parameters of the loop filter depend on the reference frequency. As the reference modulation changes the reference clock, the loop filter parameters should be changed. If the difference between the original reference clock and the modulated reference clock is small, the loop filter can be shared for both the original clock and the modulated clock as long as system specifications such as phase noise, spurious signal suppression, and lock time allows it. For example, if 8/9 modulation and 2/3 modulation for a channel shows the same spurious signal suppression, the 8/9 modulation may be preferred because the 8/9 modulated reference signal is closer to the original reference frequency than the 2/3 modulated reference signal.

4) The hardware complexity of the system. For example, while multiple modulation ratios (3/4, 5/6, 7/8, 8/9, etc.) may be acceptable for purposes of achieving a desired level of spurious signal suppression, it may not be possible to achieve all the ratios given the hardware in use. Thus, hardware may be one factor to consider when selecting a modulation ratio in accordance with the present invention.

During the time the reference signal is modulated or some predetermined time before, the values defining the modulation ratio of the Sigma-Delta modulator, $N_{\Sigma\Delta}$ and $D_{\Sigma\Delta}$, are computed along with P and S which correspond to the values of the program and swallow counters. Together, these parameters along with parameter K of prescaler 29 determine the value the pulse-swallow frequency divider uses to divide the output frequency of the VCO. One way in which parameters $N_{\Sigma\Delta}$, $D_{\Sigma\Delta}$, P, and S may be calculated will now be discussed in greater detail.

The values of $f_{vco}$, R, K, and $f_{ref}$ are preferably determined at the system or architecture level to meet, for example, the requirements of a desired application. (The R value may be related to the design specification of the PLL (e.g., R=1 if $f_{ref}$=19.2 MHz) and the K value may be related to the design of the prescaler.) The only unknown values therefore are P, S, $N_{\Sigma\Delta}$, and $D_{\Sigma\Delta}$.

$D_{\Sigma\Delta}$. This parameter maybe determined in various ways. First, $D_{\Sigma\Delta}$ maybe determined as a simple power of two, e.g., $2^{10}/2^{12}/2^{13}$ . . . . In this case, as the denominator increases, hardware complexity also increases and the frequency resolution of the PLL increases. Thus, there is a trade off between precision and hardware complexity. Second, if the frequency resolution (or channel spacing) of the system is known, $D_{\Sigma\Delta}$ maybe determined by the following equation: $D_{\Sigma\Delta}=(f_{ref}/R)/f_{ch}$. For example, in the Korean CDMA system, $f_{ref}$=19.2 MHz, R=1, and $f_{ch}$=10 kHz. Given these values, $D_{\Sigma\Delta}$=1920.

P, S, and $N_{\Sigma\Delta}$. These parameters are integer values which satisfy the following relation: $f_{vco}=(f_{ref}/R)\times(KP+S+N_{\Sigma\Delta}/D_{\Sigma\Delta})$. If two or more constraints are added to this relation, the solution is unique. The first constraint is that $0 \leq S < K$ and the second constraint is that $0 \leq N_{\Sigma\Delta} < D_{\Sigma\Delta}$. Actually, these constaints are not algorithmic but practical ones. Because the range of $N_{\Sigma\Delta}$ exceeds $D_{\Sigma\Delta}$ for many applications, the hardware complexity of the Sigma-Delta modulator increases accordingly. For example, assume that $f_{ref}$=19.2 MHz, R=1, $f_{vco}$=1920.192 MHz, K=8, and $D_{\Sigma\Delta}$=19200. Then, the term $(KP+S+N_{\Sigma\Delta}/D_{\Sigma\Delta})$=100.01, where KP+S=100 and $N_{\Sigma\Delta}/D_{\Sigma\Delta}$=0.01 as K, P and S are all integer values. Thus, P=12 and S=4 (the constraint S<K makes this integer solution unique) and $N_{\Sigma\Delta}$=192.

Second, the pulse-swallow frequency divider divides the output of the voltage-controlled oscillator $f_{vco}$ by the value in Equation (1), so that the comparison frequency input into the phase and frequency detector equals the modulated reference frequency, $$f_{mod} = \frac{N_{mod}}{D_{mod}} f_{ref}.$$

$$(K \cdot P + S) + \left(\frac{N_{\Sigma\Delta}}{D_{\Sigma\Delta}}\right) \quad (1)$$

Since the modulated reference frequency $f_{mod}$ is different from the unmodulated reference frequency $f_{ref}$, the parameters of the pulse-swallow frequency divider must be changed so that the signal input into the phase and frequency detector from the feedback loop matches the modulated reference frequency output from the reference modulator. Before being input into the phase and frequency detector, the modulated reference frequency $f_{mod}$ may be divided by the value R corresponding to an optional reference divider 31.

From Equation (1), it is clear that in order to achieve a desired output frequency signal $f_{vco}$ (which, for example, may be a local oscillator signal used in baseband signal recovery circuit of a communications transceiver), the output of the voltage-controlled oscillator must be divided by a value given by Equation (1) in the feedback loop. If the reference divider and prescaler counter values R and K are known for a given application, the remaining parameters (P, S, N) can be determined as explained above and in view of Equation (1) for a given input frequency and the VCO output frequency.

The output frequency of the PLL may be expressed by the following equation:

$$f_{vco} = \left(\frac{f_{ref}}{R}\right)\left(\frac{N_{mod}}{D_{mod}}\right)\left((K \cdot P + S) + \left(\frac{N_{\Sigma\Delta}}{D_{\Sigma\Delta}}\right)\right) \quad (2)$$

In Equation (2), the term $$\left(\frac{f_{ref}}{R}\right)\left(\frac{N_{mod}}{D_{mod}}\right)(K \cdot P + S)$$

represents the integer part of the desired frequency $f_{vco}$ and the term $$\left(\frac{f_{ref}}{R}\right)\left(\frac{N_{mod}}{D_{mod}}\right)\left(\frac{N_{\Sigma\Delta}}{D_{\Sigma\Delta}}\right)$$

represents the fractional part of this frequency.

When mismatches occur in the PLL, spurious noise signals form at frequencies which coincide with the fractional part of the desired frequency $f_{vco}$ and harmonics of this frequency. In order to achieve the separation required to filter out all or a portion of these spurious signals, the present invention controls one or more parameters in the above equation.

Initially, the modulation ratio of the Sigma-Delta modulator is controlled to achieve a desired degree of frequency separation. This may be empirically understood with reference to the fractional part of Equation (2), which corresponds to the frequency offset ($\Delta f$) between the desired frequency $f_{vco}$ and the first-order spurious signals $f_{sp1}$. (This offset may also exist between adjacent-orders of the spurious signals themselves.)

As the modulation ratio $$\frac{N_{\Sigma\Delta}}{D_{\Sigma\Delta}}$$

of the Sigma-Delta modulator increases, the frequency offset (or separation distance between the spurious signals and the desired output frequency) becomes larger. Inclusion of the term $$\frac{N_{\Sigma\Delta}}{D_{\Sigma\Delta}}$$

in the fractional part of Equation (2) thus ensures that spurious signals $f_{sp}$ of a predetermined order are formed sufficiently far from the desired output frequency $f_{vco}$ that they can be removed by loop filter 23 along the signal path. This maybe achieved, for example, by making the fractional part in Equation (2) and more specifically the ratio of $N_{\Sigma\Delta}$ and $D_{\Sigma\Delta}$ relatively large. This affects the values of P and S which, in turn, ultimately leads to an adjustment of the value of the pulse-swallow feedback divider of the PLL.

To achieve complete noise supression, the fractional part of Equation (2) is set large enough to ensure that the first-order spurious signals are shifted below the cutoff frequency of the loop filter. If desired, however, the fractional part may be set to other proper values to filter out higher-order spurious signals. While a lesser degree of noise suppression is realized in this case, other system requirements may be met, thereby making the present invention a suitable solution.

Figure 4:
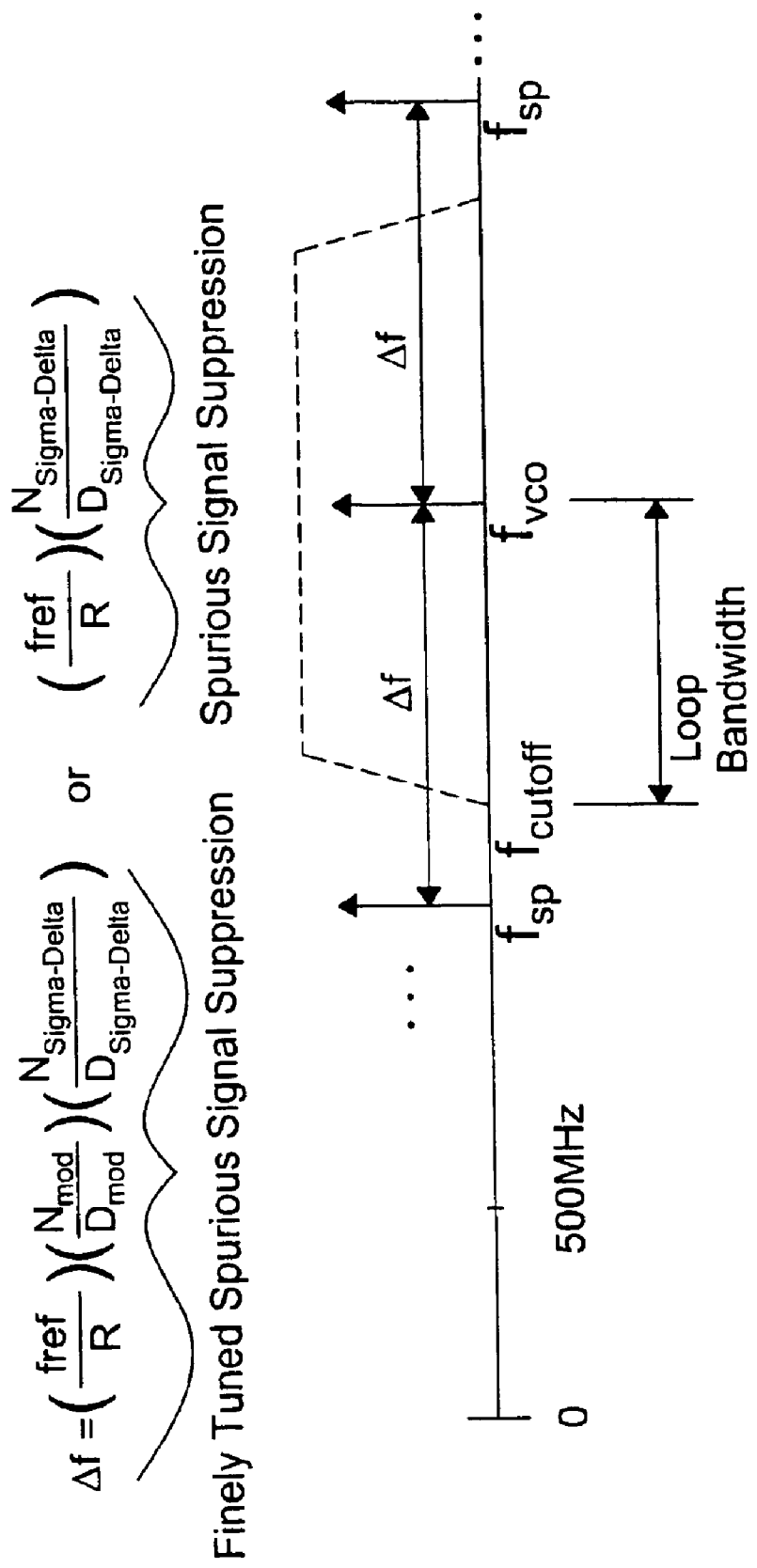
FIG. 4 is a diagram showing an example of how the system and method of the present invention may be implemented to shift spurious noise signals outside the loop bandwidth of a PLL to thereby enable them to be removed by a loop filter.

FIG. 4 shows how adjusting the values of $N_{\Sigma\Delta}$ and $D_{\Sigma\Delta}$ can lead to suppression of spurious noise signals in the output of the PLL. In this illustrative example, $f_{vco}$ corresponds to the desired output frequency of the PLL, $f_{cutoff}$ corresponds to the cutoff frequency of the loop filter, and the loop bandwidth corresponds to the difference between $f_{vco}$ and $f_{cutoff}$. In accordance with the present invention, the fractional part of Equation (2) and particularly the ratio of $N_{\Sigma\Delta}$ and $D_{\Sigma\Delta}$ is computed to be sufficiently large to shift the spurious noise signals $f_{sp1}, f_{sp2}, \ldots f_{spN}$ outside the loop bandwidth and thus in this case below cutoff frequency $f_{cutoff}$ where they can be removed by the loop filter. This shift is shown by frequency offset $\Delta f$.

The ratio of $N_{mod}$ and $D_{mod}$ of reference modulator 20 maybe controlled to further adjust the degree of separation. More specifically, while this reference modulator is considered to be an optional feature of the present invention (e.g., the frequency separation required for spurious noise suppression may be accomplished solely by adjusting the modulation ratio formed between $N_{\Sigma\Delta}$ and $D_{\Sigma\Delta}$), the ratio of $N_{mod}$ and $D_{mod}$ maybe controlled as away of fine tuning the spurious signal shift performed in the fractional part of Equation (2). The values of $N_{mod}$ and $D_{mod}$ are preferably determined based on the design of the reference modulator.

Table 1 provides examples of values which when input into Equation (2) generate a frequency separation $\Delta f$ sufficient to shift spurious noise signals outside the loop bandwidth of the PLL. These values are reflected in FIG. 4 to illustrate the superior performance of the invention.

TABLE 1

| $f_{vco}$ | $f_{ref}$ | R | $N_{mod}$ | $D_{mod}$ | K | P | S | $N_{\Sigma\Delta}$ | $D_{\Sigma\Delta}$ |
|---|---|---|---|---|---|---|---|---|---|
| 905.29 MHz | 19.68 MHz | 1 | 8 | 9 | 4 | 12 | 3 | 11817 | 15744 |

In Table 1, $N_{\Sigma\Delta}$ and $D_{\Sigma\Delta}$ values are set to 11817 and 15744 respectively and the modulation ratio of the reference signal modulator is 8/9. Plugging these values into Equation (2), the output frequency $f_{vco}$ of the PLL is calculated to be 905.29 MHz. The value corresponding to the fractional part of this equation reveals the superior performance of the present invention for this example:

$$f_{ref} \cdot \frac{N_{mod}}{D_{mod}} \cdot \frac{N_{\Sigma\Delta}}{D_{\Sigma\Delta}} = 19.68 \cdot \frac{8}{9} \cdot \frac{11817}{15744} = 13.13 \text{ MHz} \quad (3)$$

As shown by Equation (3), spurious noise signals produced from mismatches in the PLL will appear at frequencies which coincide with the fractional part of Equation (2), which is computed to be 13.13 MHz. The frequency separation $\Delta f$ between the output frequency and the first-order spurious noise signal $f_{sp1}$ will therefore be 6.55 MHz. (This number is obtained by subtracting 13.13 MHz from the frequency of the modulated input reference signal (19.68*8/9)). Using these values, the Sigma-Delta modulator shifts the first-order spurious signals outside the loop bandwidth of the PLL, thereby allowing the cutoff frequency $f_{cutoff}$ of the loop filter to eliminate these and higher-order noise signals from the output frequency. While the modulation ratio of 8/9 is used in this example and provides for fine resolution adjustment, it can be seen that an even wider frequency separation may be achieved with other reference modulating ratios.

In the foregoing example, the cutoff frequency and/or the loop bandwidth maybe determined based on the specific application requirements of the system including requirements for phase noise and spurious signal suppression. As shown, a greater suppression of the spurious signal $f_{sp}$ occurs by the loop filter as the frequency offset ($\Delta f$) increases from the carrier $f_{vco}$ increases. While optional, the reference modulation may advantageously be used to increase this frequency offset.

Also, in the foregoing example, the frequency separation was achieved at least in part by setting the modulation ratio of the Sigma-Delta modulator to a relatively large value. For comparison purposes, it is noted that a small value of this ratio would not be able to achieve the separation required for noise suppression. For example, if the $$\frac{N_{\Sigma\Delta}}{D_{\Sigma\Delta}} = 1/1968$$

and the P and S values are 11 and 2 respectively, then the resulting frequency separation would be 10 kHz for the same values of K and $f_{ref}$ using an umodulated reference frequency. This separation would in most applications lie well within the loop bandwidth of the PLL and thus would not be able to be suppressed by the loop filter.

Additionally or alternatively, in controlling the values of the Sigma-Delta modulator the numerator $N_{\Sigma\Delta}$ may be adjusted to be far away from the sub-harmonics of the denominator $D_{\Sigma\Delta}$. This means, for example, that if the ratio of the numerator and denominator $$\frac{N_{\Sigma\Delta}}{D_{\Sigma\Delta}}$$

of the Sigma-Delta modulator is near $D_{\Sigma\Delta}/2$, $D_{\Sigma\Delta}/4$, and $D_{\Sigma\Delta}/8$, the reference modulation can reduce or eliminate the spurious signals.

Figure 1A:
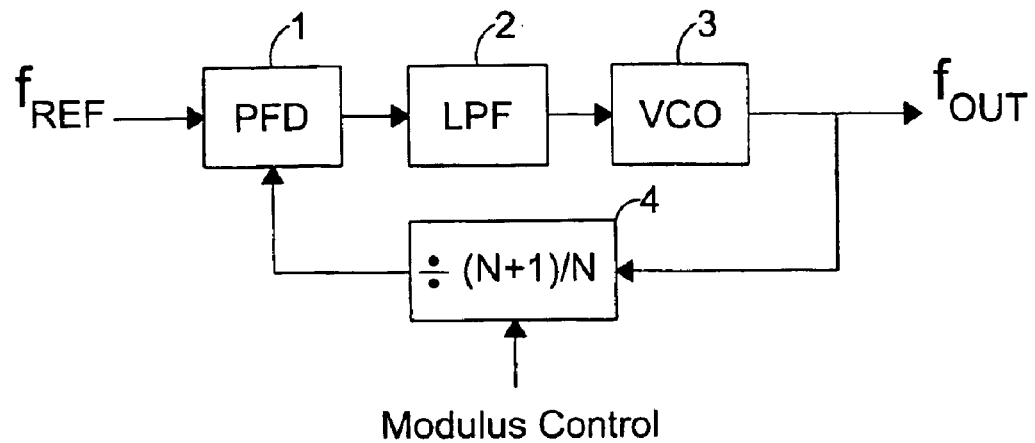
FIG. 1(a) is a diagram showing a related-art phase-locked loop circuit.
Figure 1B:
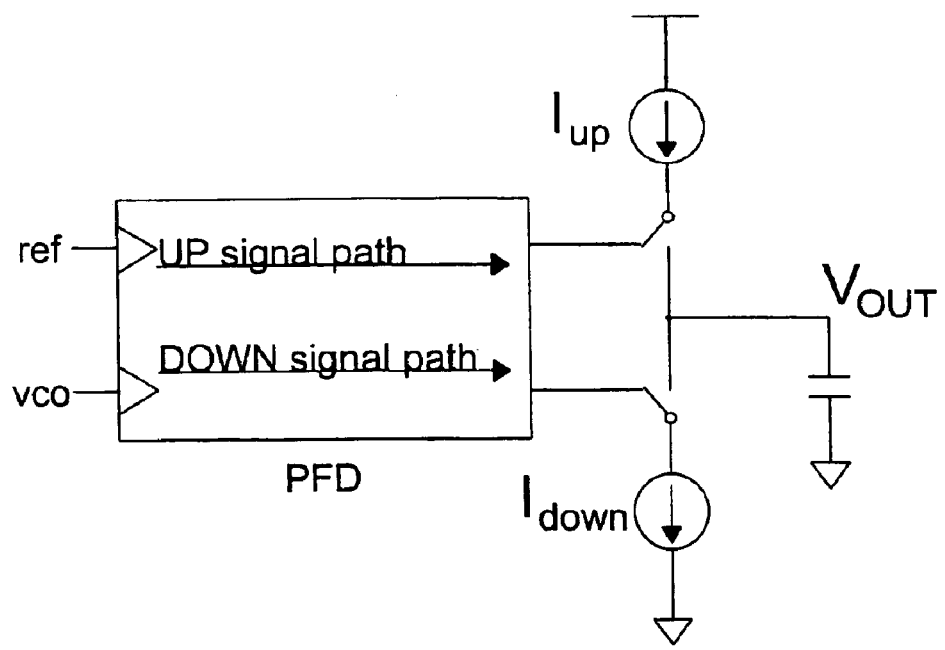
FIG. 1(b) is a diagram showing different types of mismatches that may occur in the phase and frequency detector and/or charge pump of the related-art phase-locked loop, which mismatches lead to the generation of spurious signals that degrade system performance.

The present invention thus effectively suppresses noise in a frequency generator such as a PLL in a way that substantially improves signal-to-noise ratio. This is evident by comparing the present invention to other circuits. For example, in the related-art system of FIG. 1(a), the frequency separation between the spurious noise signal and the PLL output frequency is equal to 10 kHz, which is shown to lie within the loop bandwidth of the circuit. (See FIG. 2). Because the spurious signal lies within this bandwidth, the loop filter of the FIG. 1(a) PLL will not be able to remove the spurious noise signal from the output frequency. As a result, the output of this circuit will have a lower signal-to-noise ratio than desired by many applications.

In contrast, by setting at least one of the $N_{\Sigma\Delta}$ and $D_{\Sigma\Delta}$ parameters to appropriate values based on the loop bandwidth of the PLL and then optionally modulating the input reference frequency by $$\frac{N_{mod}}{D_{mod}}$$

to perform fine tuning adjustment, the present invention ensures that spurious noise generated from loop mismatches forms far away from the output frequency of the PLL, thereby enabling their suppression by the loop filter.

In addition to achieving greater noise suppression, the system of the present invention is able to achieve faster lock times while concurrently using a wider loop bandwidth compared with other systems which have been proposed. This may be understood by realizing that PLL lock time is inversely proportional to loop bandwidth. Operating with a wider loop bandwidth will therefore allow the present invention to achieve reduced lock times compared with other PLL circuits, while simultaneously achieving an improved level of spurious signal suppression. All of these advantages translate into improved signal-to-noise ratio and thus a higher quality communications transicever.

Modulation of the reference signal maybe accomplished in a variety of ways. Preferably, the reference frequency $f_{ref}$ is modulated to ensure that $f_{mod}$ is not close to the harmonics of the original reference frequency $f_{ref}$. Performing modulation in this manner is desirable in order to avoid the possibility of having spurious noise signals reappear in the output of PLL, in spite of the modulation performed by the Sigma-Delta modulator. This may be understood with reference to the following example.

Figures 5A, 5B:
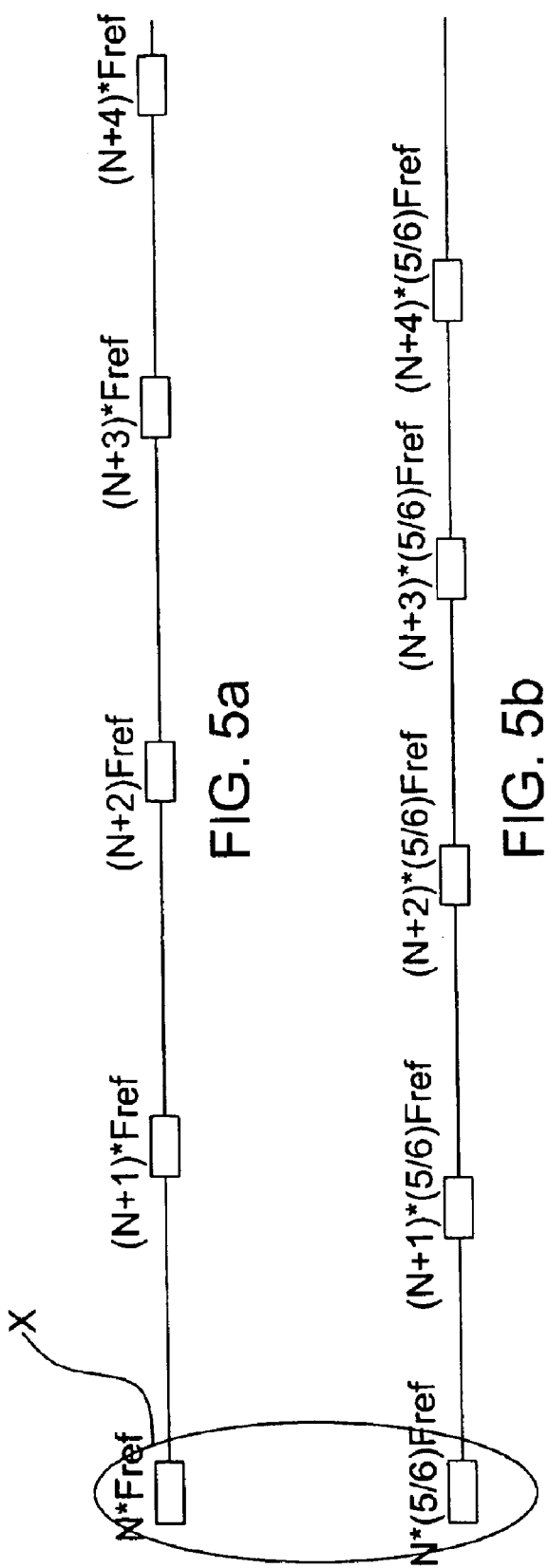
FIGS. 5(a) and 5(b) are graphs showing harmonics of an original reference frequency and a modulated reference frequency generated in accordance with one example of the present invention.

FIGS. 5(a) and 5(b) are graphs respectively showing harmonics of an original reference frequency and a modulated reference frequency generated in accordance with one example of the present invention. In FIG. 5(a), harmonics of the original reference frequency are shown as $N \cdot f_{ref}$, $(N+1) \cdot f_{ref}$, $(N+2) \cdot f_{ref}$, and so on. In FIG. 5(b), the modulated reference signal is generated based on a modulation ratio of $$\frac{N_{mod}}{D_{mod}} = \frac{5}{6}.$$

Harmonics of the modulated input reference frequency therefore appear at frequencies of $N \cdot (5/6)f_{ref}$, $(N+1) \cdot (5/6)f_{ref}$, $(N+2) \cdot (5/6)f_{ref}$, and so on.

In this example, N is assumed to be an integer and preferably a multiple of 6, and a zone where the harmonics of the modulated reference frequency and original reference signal are coincident are shown by X. In this zone, the invention may prove to be ineffective because the modulated reference frequency may not be able to suppress spurious signals in the output of the PLL. These principles may serve as a basis for defining the operating range of the Sigma-Delta controlled PLL of the present invention. More specifically, as shown in FIGS. 5(a) and 5(b), the modulated reference frequency may be used as the comparison frequency input into the phase and frequency detector, instead of the original reference frequency, until harmonics of the modulated reference frequency become equal to the harmonics of the original reference frequency.

If no restriction on chip area exists, various values of $N_{mod}$ and $D_{mod}$ maybe used for a given frequency channel. For example, an $N_{mod}/D_{mod}$ of 5/6 may be desirable to effect spurious signal suppression for one channel but an $N_{mod}/D_{mod}$ of 8/9 maybe desirable for another channel. Also, for any given channel both modulation ratios may be acceptable. By changing the value of $N_{mod}/D_{mod}$, a variety of acceptable frequency offsets may be achieved for purposes of spurious signal suppression. The one that is most compatible to the system (e.g., given hardware complexity) may be selected.

Figure 6:
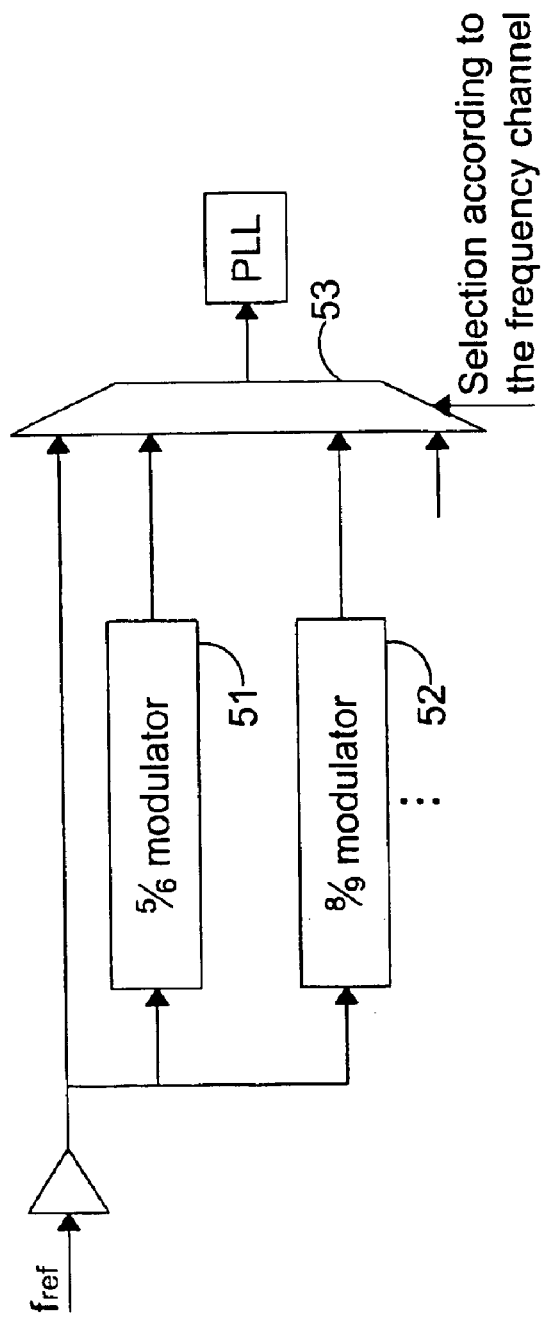
FIG. 6 is a diagram showing one embodiment of the reference modulator of the present invention.

FIG. 6 shows one type of reference modulator of the present invention which can achieve the flexibility discussed above. This modulator is formed from two reference modulators 51 and 52 and a selector 53 maybe included to select the appropriate modulation ratio $N_{mod}/D_{mod}$ for the applicable channel. The first modulator has a modulation ratio of 5/6 and the second modulator a ratio of 8/9. While two modulators are shown, those skilled in the art can appreciate that the reference modulator of the present invention may include more than two modualtors, e.g., one modulator maybe provided for each channel or group of channels in the communications system. In this case, each modulator may have a modulation ratio selected specifically, and preferably optimally, for that channel or channel group. For channels which have no spurious tones, the reference modulator maybe omitted or circumscribed and the reference clock may be fed directly to the internal PLL block.

Figure 7:
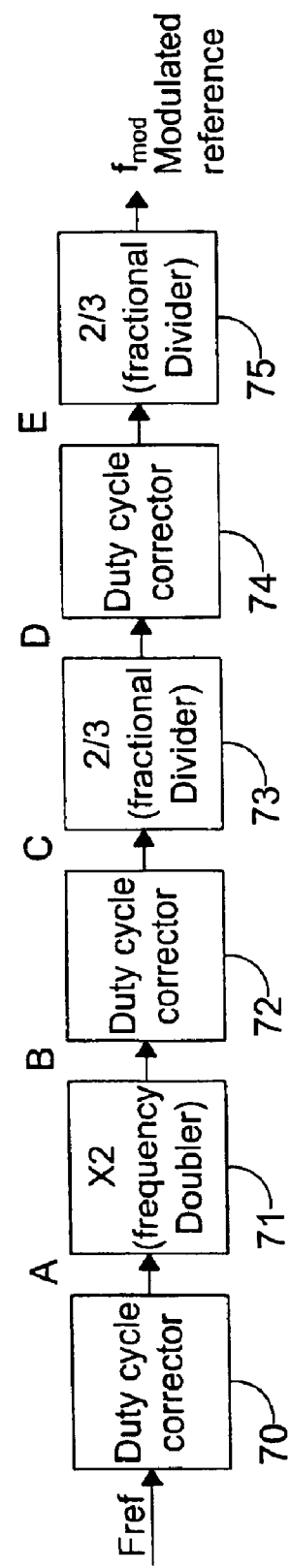
FIG. 7 is a diagram showing another embodiment of the reference modulator of the present invention.

FIG. 7 shows another way in which the reference modulator of the present invention may be constructed to produce these results. This modulator includes a first duty cycle corrector 70, a frequency doubler 71, a second duty cycle corrector 72, a fractional divider 73, a third duty cycle corrector 74, and another fractional divider 75. The fractional dividers are set to multiple their input signals by 2/3. Those skilled in the art can appreciate, however, that other fractional values maybe used if desired.

Figure 8:
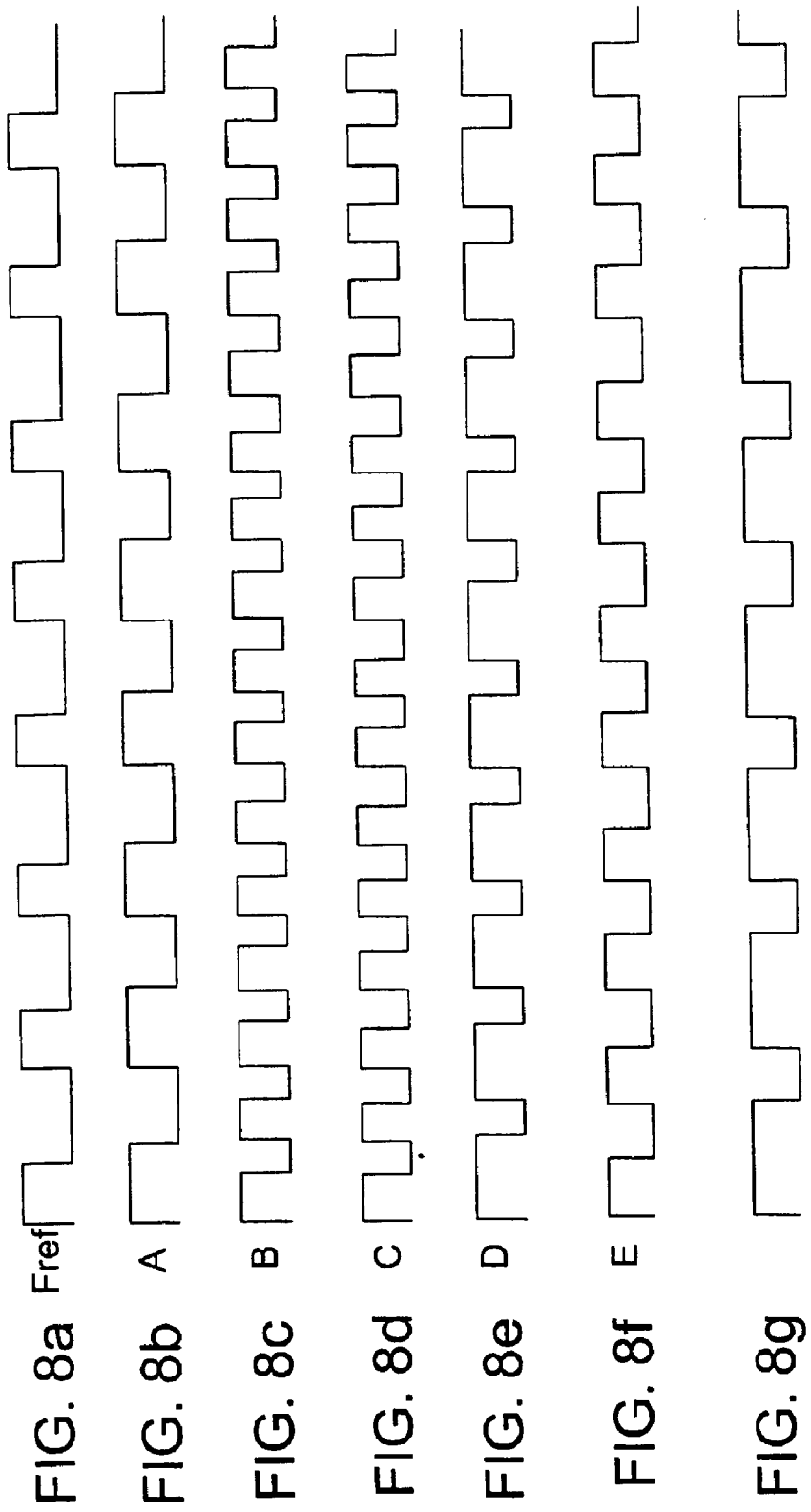
FIGS. 8(a)–8(g) are diagrams showing the manner in which signals are processed by each of the elements of the reference modulator shown in FIG. 7.

FIGS. 8(a)–8(g) are diagrams showing the manner in which signals are processed by each of the elements of the reference modulator shown in FIG. 7. FIG. 8(a) shows the original reference frequency $f_{ref}$ input into the reference modulator. FIG. 8(b) shows that the first duty cycle corrector processes the original reference to produce a clean signal by removing sub-harmonic components therefrom. FIG. 8(c) shows that the frequency doubler doubles the frequency of the signal output from the first duty cycle corrector. This results in cutting the period of the signal in half. FIG. 8(d) shows that the second duty cycle corrector cleans up the output of the frequency doubler by removing sub-harmonics. FIG. 8(e) shows that the signal output from the second duty cycle corrector is multiplied by a predetermined fraction, which in this example is 2/3.

FIG. 8(f) shows that the third duty cycle corrector cleans up the output of the first fractional divider by removing sub-harmonics. This causes the period of the signal to be increased by an amount commensurate with the division performed by the first fractional divider.

FIG. 8(g) shows that the signal output from the third duty cycle corrector is multiplied by a predetermined fraction, which in this example is also 2/3. The result is to produce a modulated reference frequency. Once this signal is processed to remove harmonics, the final modulated reference signal is produced whose period is increased by an amount commensurate with the division performed by the second fractional divider.

In the foregoing embodiment of the reference modulator, the numerator of the reference modulator should be different from one in order to increase operating range of the PLL while simultaneously preventing a reformation of the spurious signals. In fact, it maybe preferable to usea high value of the numerator. The fractional divider and frequency doubler maybe adapted to generate a numerator of this type.

For instance, in the example previously discussed one frequency doubler and two fractional dividers were used to generate the modulated reference signal, equal to $$f_{mod} = \frac{N_{mod}}{D_{mod}} f_{ref} = \frac{8}{9} f_{ref}.$$

Also, one frequency doubler and two fractional dividers were used to generate the modulated reference frequency, with the same fraction of 2/3 used for both dividers. While these values maybe preferable, those skilled in the art can appreciate that any number of the frequency multiplication and division circuits may be used, as long as a desired fractional division ratio $$\frac{N_{mod}}{D_{mod}}$$

is achieved.

Figure 9:
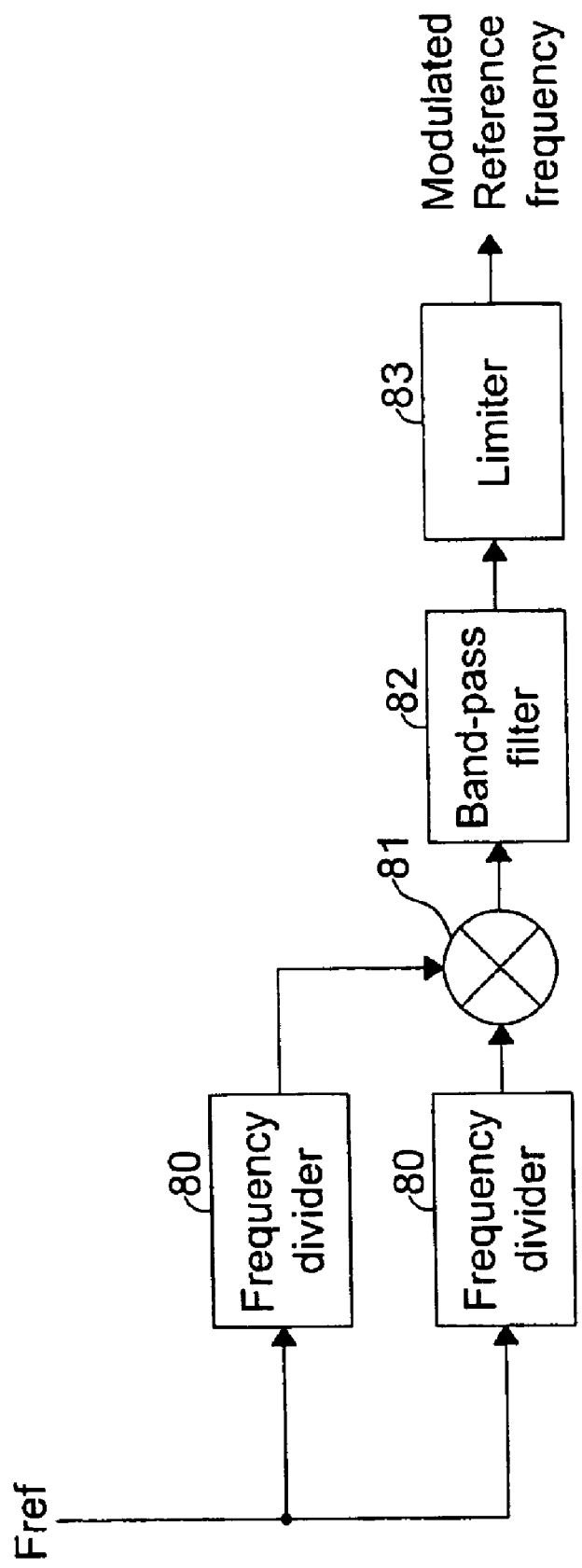
FIG. 9 is a diagram showing one embodiment of the reference modulator of the present invention.

FIG. 9 shows another way in which the reference frequency modulator of the present invention may be constructed. This modulator includes a number of frequency dividers 80 connected to a mixer 81. The frequency dividers multiply the original reference frequency $f_{ref}$ by values which, when input into the mixer, generate the desired fractional frequency. For example, the frequency dividers may output signals equal to $$\frac{4}{9} f_{ref}.$$

The mixer will then output a signal equal to $$\frac{8}{9} f_{ref}.$$

After mixing, unwanted harmonics generated from the mixer are filtered out using a bandpass filter 82. A limiter 83 is then used to produce the modulated reference frequency in the form of a digital pulse.

EXAMPLE

Table 2 shows exemplary values that may be used in accordance with the present invention. To achieve an acceptable level of spur reduction, the $$\frac{N_{\Sigma\Delta}}{D_{\Sigma\Delta}}$$

ratio is selected to be large to shift spurious signals outside the cutoff frequency. Also, the reference frequency $f_{ref}$ is modulated by an $$\frac{N_{mod}}{D_{mod}}$$

ratio which ensures that the harmonics of $f_{mod}$ is not close to the harmonics of the original reference frequency $f_{ref}$.

TABLE 2

| Nearest N for Fvco/Fref | Fvco | Fref | Fvco/Fref | R | K | P | S | N | D | N/D | Nmod | Dmod |
|---|---|---|---|---|---|---|---|---|---|---|---|---|
| 46 | 905.29 | 19.68 | 46.00051 | 1 | 4 | 11 | 2 | 1 | 1968 | 0.0005081 | 8 | 9 |
| 47 | 924.97 | 19.68 | 47.00051 | 1 | 4 | 11 | 3 | 1 | 1968 | 0.0005081 | 8 | 9 |
| 48 | 944.65 | 19.68 | 48.00051 | 1 | 4 | 12 | 0 | 1 | 1968 | 0.0005081 | 8 | 9 |
| 49 | 964.38 | 19.68 | 49.00051 | 1 | 4 | 12 | 1 | 1 | 1968 | 0.0005081 | 8 | 9 |
| 50 | 984.01 | 19.68 | 50.00051 | 1 | 4 | 12 | 2 | 1 | 1968 | 0.0005081 | 8 | 9 |
| 51 | 1003.7 | 19.68 | 51.00051 | 1 | 4 | 12 | 3 | 1 | 1968 | 0.0005081 | 8 | 9 |
| 52 | 1023.4 | 19.68 | 52.00051 | 1 | 4 | 13 | 0 | 1 | 1968 | 0.0005081 | 8 | 9 |
| 53 | 1043.1 | 19.68 | 53.00051 | 1 | 4 | 13 | 1 | 1 | 1968 | 0.0005081 | 8 | 9 |

TABLE 2-continued

| 54 | 1062.7 | 19.68 | 54.00051 | 1 | 4 | 13 | 2 | 1 | 1968 | 0.0005081 | 8 | 9 |
| 55 | 1082.1 | 19.68 | 55.00051 | 1 | 4 | 13 | 3 | 1 | 1968 | 0.0005081 | 8 | 9 |
| 56 | 1102.1 | 19.68 | 56.00051 | 1 | 4 | 14 | 0 | 1 | 1968 | 0.0005081 | 8 | 9 |
| 57 | 1121.8 | 19.68 | 57.00051 | 1 | 4 | 14 | 1 | 1 | 1968 | 0.0005081 | 8 | 9 |
| 58 | 1141.5 | 19.68 | 58.00051 | 1 | 4 | 14 | 2 | 1 | 1968 | 0.0005081 | 8 | 9 |
| 59 | 1161.1 | 19.68 | 59.00051 | 1 | 4 | 14 | 3 | 1 | 1968 | 0.0005081 | 8 | 9 |

Worst Case Spur Example

| Nearest N for Fvco/Fref | Frefx Nmod/Dmod | Fvco/ (Frefx Nmod/Dmod) | R | K | P | S | Nnew | Dnew | Nnew/ Dnew | |
|---|---|---|---|---|---|---|---|---|---|---|
| 46 | 17.498 | 51.751 | 1 | 4 | 12 | 3 | 11817 | 15744 | 0.750572 | |
| 47 | 17.498 | 52.876 | 1 | 4 | 13 | 0 | 13785 | 15744 | 0.875572 | |
| 48 | 17.498 | 54.001 | 1 | 4 | 13 | 2 | 9 | 15744 | 0.000572 | Frefx9 Ranges |
| 49 | 17.498 | 55.126 | 1 | 4 | 13 | 3 | 1977 | 15744 | 0.125572 | as shown in |
| 50 | 17.498 | 56.251 | 1 | 4 | 14 | 0 | 3945 | 15744 | 0.250572 | FIG. 5a, b. |
| 51 | 17.498 | 57.376 | 1 | 4 | 14 | 1 | 5913 | 15744 | 0.375572 | |
| 52 | 17.498 | 58.501 | 1 | 4 | 14 | 2 | 7881 | 15744 | 0.500572 | |
| 53 | 17.498 | 59.626 | 1 | 4 | 14 | 3 | 9849 | 15744 | 0.625572 | |
| 54 | 17.498 | 60.751 | 1 | 4 | 15 | 0 | 11817 | 15744 | 0.750572 | |
| 55 | 17.498 | 61.876 | 1 | 4 | 15 | 1 | 13785 | 15744 | 0.875572 | |
| 56 | 17.498 | 63.001 | 1 | 4 | 15 | 3 | 9 | 15744 | 0.000572 | |
| 57 | 17.498 | 64.126 | 1 | 4 | 16 | 0 | 1977 | 15744 | 0.125572 | |
| 58 | 17.498 | 65.251 | 1 | 4 | 16 | 1 | 3945 | 15744 | 0.250572 | |
| 59 | 17.498 | 66.376 | 1 | 4 | 16 | 2 | 5913 | 15744 | 0.375572 | |

Nnew/Dnew ratio is far from 0 or 1

In Table 2, $$\frac{N_{mod}}{D_{mod}} = 8/9$$

is used and $N_{new}$ and $D_{new}$ respectively correspond to the Sigma-Delta modulator values of $N_{\Sigma\Delta}$ and $D_{\Sigma\Delta}$. The worst case spur is shown to exist between 905.29 MHz and 1161.13 MHz. (The N and D columns make up the N/D ratio which corresponds to the worst-case spur, e.g., N/D=1/1968. The ratio of N/D=1967/1968 is not included because it has the same characteristics shown in the Table 2.) The worst-case spur is near at a multiple of the reference clock frequency. They are listed from $46f_{ref}$ to $59f_{ref}$ as an example. Also, an 8/9 reference modulation is used as an example. Note that the Sigma-Delta modulation ratio $$\frac{N_{new}}{D_{new}}$$

ratio has a circular relation according to $f_{vco}$ or multiples of the reference clock as in FIG. 5, e.g., the ratio of $$\frac{N_{new}}{D_{new}} = 9/15744,$$

1977/15744, . . . , 11817/15744, 13785/15744 is repeated.

Not all the values of in Table 2 are optimal. For example, in the case where $f_{vco}$=944.65, the Sigma-Delta modulation ratio $$\frac{N_{new}}{D_{new}} = 9/15744.$$

This produces a frequency separation of 10 kHz when a reference modulation rato $$\frac{N_{mod}}{D_{mod}} = 8/9$$

This 10 kHz separation may in some instances prove to be insufficient for purposes of achieving spurious signal suppression. In this case, the reference signal modulation ratio maybe changed to produce a frequency separation sufficient to achieve an acceptable level of spurious signal supression. In the example under consideration, this may be accomplished by setting $$\frac{N_{mod}}{D_{mod}} = 5/6.$$

A comparison of the results obtained for these modulation ratios is set forth in Table 3.

TABLE 3

| Nearest N for Fvco/Fref | Fvco | Fref | Fvco/ Fref | R | K | P | S | N | D | N/D | Nmod | Dmod |
|---|---|---|---|---|---|---|---|---|---|---|---|---|
| 48 | 944.66 | 19.68 | 48.00051 | 1 | 4 | 12 | 0 | 1 | 1968 | 0.0005081 | 8 | 9 |
| 48 | 944.66 | 19.68 | 48.00051 | 1 | 4 | 12 | 0 | 1 | 1968 | 0.0005081 | 5 | 6 |

Worst Case Spur Example

TABLE 3-continued

| Nearest N for Fvco/Fref | Frefx Nmod/ Dmod | Fvco/(Frefx Nmod/Dmod) | R | K | P | S | Nnew | Dnew | Nnew/Dnew | |
|---|---|---|---|---|---|---|---|---|---|---|
| 48 | 17.498 | 54.001 | 1 | 4 | 13 | 2 | 9 | 15744 | 0.000572 | Frefz9 Ranges |
| 48 | 16.400 | 57.601 | 1 | 4 | 14 | 1 | 5910 | 9840 | 0.600610 | Frefx9 Ranges |
| | | | | | | | | | Nnew/Dnew ratio is far from o or | |

Using the modulation ratio of 5/6 instead of 8/9, the following frequency offset is obtained: $f_{ref}*(N_{mod}/D_{mod})*(N_{new}/D_{new})=19.68*(5/6)*(5910/9840)=9.85$ MHz. This offset is considerably larger than the 10 kHz offset obtained using the 8/9 modulation ratio and in fact large enough to shift spurious noise outside the cutoff frequency of the loop filter in this example, thereby achieving spurious signal suppression. From this example, it is therefore evident that at least one and preferably both of $$\frac{N_{mod}}{D_{mod}} \text{ and } \frac{N_{\Sigma\Delta}}{D_{\Sigma\Delta}}$$

may be controlled to suppress spurious signals to thereby improve signal-to-noise ratio in a communications receiver.

Other modifications and variations to the invention will be apparent to those skilled in the art from the foregoing disclosure. Thus, while only certain embodiments of the invention have been specifically described herein, it will be apparent that numerous modifications maybe made thereto without departing from the spirit and scope of the invention.

We claim:

1. A noise suppression method, comprising:
   generating a frequency signal from a PLL based on a reference signal; and
   removing noise from the frequency signal by setting a frequency divider in a feedback loop of the PLL to a value which shifts a spurious signal of a predetermined order outside a loop bandwidth of the PLL, wherein setting the frequency divider includes:
   adjusting at least one of a swallow counter and a program counter in the frequency divider to a value which shifts the spurious signal of said predetermined order outside the loop bandwidth of the PLL.

2. The method of claim 1, wherein the loop bandwidth is defined by a cutoff frequency of a loop filter in the PLL.

3. The method of claim 1, wherein the loop bandwidth corresponds to a frequency range that lies between the frequency signal generated from the PLL and a cutoff frequency of a loop filter in the PLL.

4. The method of claim 1, wherein said noise is removed by:
   adjusting at least one of the swallow counter and program counter to a value which shifts a first-order spurious signal outside the loop bandwidth of the PLL.

5. The method of claim 1, wherein at least one of the swallow counter and program counter is set by a Sigma-Delta modulator.

6. The method of claim 5, further comprising:
   computing a modulation ratio of the Sigma-Delta modulator based on the loop bandwidth of the PLL; and
   setting the value of at least one of the swallow counter and program counter based on the modulation ratio computed for the Sigma-Delta modulator.

7. The method of claim 1, wherein the spurious signal is generated by a mismatch relating to at least one of a phase and frequency detected and a charge pump of the PLL.

8. The method of claim 1, wherein the spurious signal is generated from a mismatch in at least one of a charge pump and phase/frequency detector in the PLL.

9. The method of claim 8, wherein the mismatch in the charge pump includes a mismatch between UP and DOWN current sources.

10. The method of claim 8, wherein the spurious signal is generated from a mismatch between UP and DOWN signal paths in the phase/frequency detector.

11. The method of claim 1, wherein the value of the frequency divider is set based on a modulation ration of a Sigma-Delta modulator for removing the spurious signal.

12. The method of claim 1, further comprising:
    shifting the reference signal to a fractional fixed value for input into a phase/frequency detector of the PLL, said fractional fixed value further shifting the spurious signal of said predetermined order.

13. The method of claim 1, wherein the swallow counter and program counter are both adjusted to shift the spurious signal of said predetermined order outside the loop bandwidth of the PLL.

14. The method of claim 13, wherein values for the swallow and program counters are controlled based on the modulation ratio of the Sigma-Delta modulator, said values for the swallow and program counters being controlled to generate said value which shifts the spurious signal of said predetermined order outside the loop bandwidth of the PLL.

15. The method of claim 14, wherein the frequency signal of the PLL ($f_{VCO}$) is generated in accordance with the following equation:

$$f_{vco} = \left(\frac{f_{ref}}{R}\right)\left((K \cdot P + S) + \left(\frac{N_{\Sigma\Delta}}{D_{\Sigma\Delta}}\right)\right),$$

where $f_{ref}$ is the reference signal, R is a value of a reference signal divider, P is the value of the program counter, S is the value of the swallow counter, $N_{\Sigma\Delta}$ and $D_{\Sigma\Delta}$ is the modulation ratio of the Sigma-Delta modulator, and K is a value of the prescaler in the pulse swallow frequency divider.

16. The method of claim 14, further comprising:
    modulating the reference signal input into the PLL.

17. The method of claim 16, wherein the frequency signal of the PLL ($f_{VCO}$) is generated in accordance with the following equation:

$$f_{vco} = \left(\frac{f_{ref}}{R}\right)\left(\frac{N_{mod}}{D_{mod}}\right)\left((K \cdot P + S) + \left(\frac{N_{\Sigma\Delta}}{D_{\Sigma\Delta}}\right)\right)$$

where $f_{ref}$ is the reference signal, R is a value of a reference signal divider, $N_{mod}$ and $D_{mod}$ define a modulation ratio for the reference signal, P is the value of the program counter, S is the value of the swallow counter, $N_{\Sigma\Delta}$ and $D_{\Sigma\Delta}$ is the modulation ratio of the Sigma-Delta modulator, and K is the value of a prescaler in the pulse swallow frequency divider.

18. The method of claim 16, further comprising:
using the modulated reference signal as a comparison signal for the PLL as long as harmonics of the modulated reference signal and the unmodulated reference signal are not coincident.

19. A frequency generator, comprising:
a phase-locked loop which generates a frequency signal based on a reference signal; and
a noise suppressor which shifts a spurious signal of a predetermined order outside a loop bandwidth of the PLL, wherein the noise suppressor includes a frequency divider in a feedback loop of the phase-locked loop, and a controller which sets the frequency divider to a value which shifts the spurious signal of said predetermined order outside the loop bandwidth of the phase-locked loop, and
wherein the frequency divider includes a swallow counter and a program counter and wherein values for the swallow and program counters are controlled based on a modulation ratio of a Sigma-Delta modulator, said values for the swallow and program counters being controlled to generate said value which shifts the spurious signal of said predetermined order outside the loop bandwidth of the phase-locked loop.

20. The frequency generator of claim 19, wherein the phase-locked loop includes a loop filter, and the loop bandwidth is defined by a cutoff frequency of the loop filter.

21. The frequency generator of claim 19, wherein the phase-locked loop includes a loop filter, and the loop bandwidth corresponds to a frequency range that lies between the frequency signal generated from the PLL and a cutoff frequency of the loop filter.

22. The frequency generator of claim 19, wherein said values of the swallow and program counters are controlled to shift a first-order spurious signal outside the loop bandwidth of the phase-locked loop.

23. The frequency generator of claim 19, wherein the PLL generates the frequency signal ($f_{vco}$) in accordance with the following equation:

$$f_{vco} = \left(\frac{f_{ref}}{R}\right)\left((K \cdot P + S) + \left(\frac{N_{\Sigma\Delta}}{D_{\Sigma\Delta}}\right)\right)$$

where $f_{ref}$ is the reference signal, R is a value of a reference signal divider, P is the value of the program counter, S is the value of the swallow counter, $N_{\Sigma\Delta}$ and $D_{\Sigma\Delta}$ is the modulation ratio of the Sigma-Delta modulator, and K is a value of the prescaler in the pulse swallow frequency divider.

24. The frequency generator of claim 19, further comprising:
a modulator which modulates the reference signal input into the phase-locked loop.

25. The frequency generator of claim 24, wherein the PLL generates the frequency signal in accordance with the following equation:

$$f_{vco} = \left(\frac{f_{ref}}{R}\right)\left(\frac{N_{mod}}{D_{mod}}\right)\left((K \cdot P + S) + \left(\frac{N_{\Sigma\Delta}}{D_{\Sigma\Delta}}\right)\right)$$

where $f_{ref}$ is the reference signal, R is a value of a reference signal divider, $N_{mod}$ and $D_{mod}$ define a modulation ratio for the reference signal, P is the value of the program counter, S is the value of the swallow counter, $N_{\Sigma\Delta}$ and $D_{\Sigma\Delta}$ is the modulation ratio of the Sigma-Delta modulator, and K is the value of a prescaler in the pulse swallow frequency divider.

26. The frequency generator of claim 24, wherein the modulated reference signal is used as a comparison signal for the PLL as long as harmonics of the modulated reference signal are not coincident with harmonics of the unmodulated reference signal.

27. The frequency generator of claim 24, wherein the spurious signal is generated from a mismatch relating to at least one of a phase and frequency detector and a charge pump of the PLL.

28. The frequency generator of claim 19, further comprising:
a frequency shifter which shifts the reference signal to a fractional fixed value for input into a phase/frequency detector of the PLL, said fractional fixed value further shifting the spurious signal of said predetermined order.

29. A system for controlling a PLL, comprising:
a divider which divides a frequency signal output from the PLL; and
a controller which sets the divider to a value which shifts a spurious noise signal of a predetermined order outside loop bandwidth of the PLL, wherein the divider includes a swallow counter and a program counter, and
wherein values for the swallow and program counters are controlled based on a modulation ratio of a Sigma-Delta modulator, said values for the swallow and program counters being controlled to generate said value which shifts the spurious signal of said predetermined order outside the loop bandwidth of the phase-locked loop.

30. The system of claim 29, wherein the loop bandwidth is defined by a cutoff frequency of a loop filter of the PLL.

31. The system of claim 29, wherein the loop bandwidth corresponds to a frequency range that lies between the frequency signal and a cutoff frequency of a loop filter in the PLL.

32. The system of claim 29, wherein said values of the swallow and program counters shift a first-order spurious signal outside the loop bandwidth of the phase-locked loop.

33. The system of claim 27, wherein the controller controls the PLL to generate the output frequency signal in accordance with the equation:

$$f_{vco} = \left(\frac{f_{ref}}{R}\right)\left(\frac{N_{mod}}{D_{mod}}\right)\left((K \cdot P + S) + \left(\frac{N_{\Sigma\Delta}}{D_{\Sigma\Delta}}\right)\right)$$

where $f_{ref}$ is the reference signal, R is a value of a reference signal divider, P is the value of the program counter, S is the value of the swallow counter, $N_{\Sigma\Delta}$ and $D_{\Sigma\Delta}$ is the modulation ratio of the Sigma-Delta modulator, and K is a value of the prescaler in the pulse swallow frequency divider.

34. The system of claim 29, wherein the controller includes:
a modulator which modulates a reference signal of the PLL.

35. The system of claim 34, wherein the controller controls the PLL to generate the output frequency signal based on the equation $$f_{vco} = \left(\frac{f_{ref}}{R}\right)\left(\frac{N_{mod}}{D_{mod}}\right)\left((K \cdot P + S) + \left(\frac{N_{\Sigma\Delta}}{D_{\Sigma\Delta}}\right)\right)$$

where $f_{ref}$ is the reference signal, R is a value of a reference signal divider, $N_{mod}$ and $D_{mod}$ define a modulation ratio for the reference signal, P is the value of the program counter, S is the value of the swallow counter, $N_{\Sigma\Delta}$ and $D_{\Sigma\Delta}$ is the modulation ratio of the Sigma-Delta modulator, and K is the value of a prescaler in the pulse swallow frequency divider.

36. The system of claim 34, wherein the modulated reference signal is used as a comparison signal of the PLL as long as a harmonic of the modulated reference signal is not coincident with a harmonic of unmodulated reference signal.

37. The system of claim 29, wherein the spurious noise signal is generated from a mismatch relating to at least one of a phase and frequency detector and a charge pump of the PLL.

38. A noise suppression method, comprising:
  generating a frequency signal from a PLL based on a reference signal; and
  removing noise from the frequency signal by setting a frequency divider in a feedback loop of the PLL to a value which shifts a spurious signal of a predetermined order outside a loop bandwidth of the PLL, wherein the frequency divider is a pulse swallow frequency divider which includes a swallow counter and a program counter, and wherein values for at least one of the swallow and program counters are controlled based on the modulation ratio of the Sigma-Delta modulator.

39. The method of claim 38, wherein a numerator of the modulation ratio ($N_{\Sigma\Delta}$) is at least 50% of a denominator of the modulation ratio ($D_{\Sigma\Delta}$).

40. The method of claim 39, further comprising:
  modulating the reference signal into the PLL with a reference modulator, wherein the reference modulator has a modulation ratio ($N_{mod}/D_{mod}$) such that $N_{mod}$ is at least 50% of $D_{mod}$.

* * * * *